United States Patent
Millik et al.

(10) Patent No.: US 7,091,586 B2
(45) Date of Patent: Aug. 15, 2006

(54) DETACHABLE ON PACKAGE VOLTAGE REGULATION MODULE

(75) Inventors: Debendra Millik, Chandler, AZ (US); Priyavadan R. Patel, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/701,765

(22) Filed: Nov. 4, 2003

(65) Prior Publication Data

US 2005/0093120 A1 May 5, 2005

(51) Int. Cl.
*H01L 23/02* (2006.01)
(52) U.S. Cl. ............................ 257/685; 361/688
(58) Field of Classification Search ............... 257/685; 361/688, 736, 748
See application file for complete search history.

(56) References Cited

U.S. PATENT DOCUMENTS

| | | | |
|---|---|---|---|
| 5,734,555 A | 3/1998 | McMahon | |
| 5,982,635 A | 11/1999 | Menzies et al. | |
| 6,469,908 B1 * | 10/2002 | Patel et al. | 361/760 |
| 2002/0145839 A1 * | 10/2002 | Smith et al. | 361/88 |

FOREIGN PATENT DOCUMENTS

| | | |
|---|---|---|
| WO | WO 01/65344 A2 | 9/2001 |
| WO | PCT/US2004/035997 | 5/2005 |

* cited by examiner

*Primary Examiner*—Tuan H. Nguyen
(74) *Attorney, Agent, or Firm*—Blakely, Sokoloff, Taylor & Zafman LLP (57) ABSTRACT

An integrated circuit (IC) package that includes an on-package voltage regulation module (VRM). An IC die is flip-bounded to a substrate having a plurality of connections to couple to a socket or to be mounted directly to a circuit board. An integrated heat spreader (IHS) is thermally coupled to the IC die and coupled (both electrically and mechanically) to the substrate. A VRM is coupled to the IHS. The IHS, which serves as an interconnect member, includes interconnect provisions for electrically coupling the VRM to the substrate. In one embodiment, the body of the IHS serves as a ground plane, while a separate interconnect layer includes electrical traces for routing electrical signals between the VRM and substrate. The VRM may comprise a detachable package that is coupled to the IHS via one of several means including fasteners, edge connectors and a parallel coupler.

27 Claims, 6 Drawing Sheets

DETACHABLE ON PACKAGE VOLTAGE REGULATION MODULE

FIELD OF THE INVENTION

The field of invention relates generally to computer systems and, more specifically but not exclusively relates to packaging schemes for voltage regulation modules.

BACKGROUND INFORMATION

An important aspect of any computer system is power provisioning. Generally, regulated power must be supplied to various system components, such as peripheral devices, circuit boards, and integrated circuits. Under a typical configuration, a power supply is used to convert alternating current (AC) input to various direct current (DC) voltage outputs that are supplied to the computer system. The power supply provides a certain level of power conditioning that is suitable for many of the system components. However, the voltage conditioning provided by the power supply is generally insufficient for powering critical components, such as the system processor(s).

In order to provide enhanced power conditioning, many systems employ a specially-configured voltage regulator or voltage regulation module (VRM). The voltage regulator or VRM receives "pre-conditioned" DC input from the power supply, and further conditions the input to remove transient voltages and the like. This power condition functionality is accomplished by passing the input voltage through various filter components, including passive and/or active filter elements. For a voltage regulator, the voltage regulation components are mounted directly on the motherboard (or other circuit board), while for a VRM the voltage regulation components are mounted to a separate board that is coupled to the motherboard (or other circuit board) via a connector. For many servers, the VRM is a detachable module that is coupled to the motherboard via a connector that employs a built-in locking mechanism to secure the module in place.

Figure 1A:
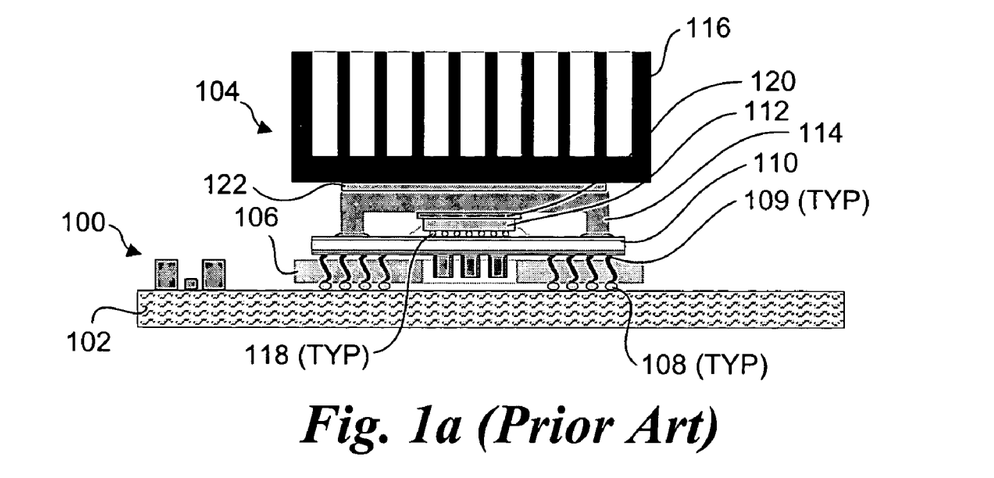
FIGS. 1a and 1b are elevation cross-section views of conventional IC packaging schemes common to the prior art.

A typical voltage regulator mounting scheme is shown in FIG. 1a. Under this example, voltage regulator components 100 are mounted to a motherboard 102. A power supply (not shown) is also coupled to the motherboard 102, and provides input power to voltage regulator components 100 via corresponding power planes/traces formed on the motherboard (also not shown). A processor package 104 is coupled to motherboard 102 via a socket 106. Typically, socket 106 is mounted to motherboard 102 using a solder reflow process, resulting in a plurality of solder connections 108. Generally, socket 106 may comprise a conventional socketed connector or a zero insertion force (ZIF) connector, either of which comprise a plurality of socket connections 109.

Processor package 104 includes a package substrate 110, a processor die 112, an integrated heat spreader (IHS) 114, and a heat sink 116. The underside of processor die 112 is "flip bonded" to package substrate 110 via a plurality of solder balls 118. The topside of the processor die is thermally coupled to IHS 114 via a thermal paste 120. Heat sink 116 will usually be coupled to IHS 114 in a manner that supports excellent heat transfer between the components, such as via a thermal paste 122. These coupling means further include solders and mechanical mounting techniques, such as mounting clips and the like.

Figure 1B:
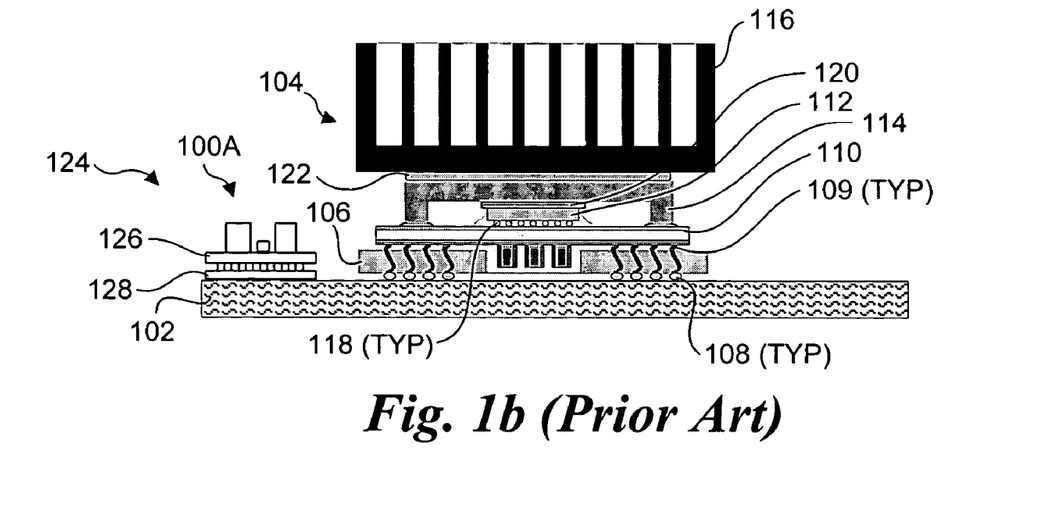

An alternative conventional voltage regulator scheme is shown in FIG. 1b. Under this scheme, a VRM 124 comprising voltage regulator components 100A mounted on a circuit board 126 is coupled to motherboard 102 via a connector 128.

The conventional voltage regulator and VRM mounting schemes have several drawbacks. First, since the voltage regulation components or VRM are coupled to the motherboard, it is necessary to route power from the regulated voltage output through the motherboard to the processor. With the ever-increasing processor speeds, a corresponding increase in power consumption has followed. Since the supply voltage (e.g., 3.3 volts) to the processor must remain low, the heat generated via the power traces in the motherboard has increased in parallel with the increase in processor power consumption. This leads to overheating of the motherboard power traces and thermal stresses on solder connections 108 and/or the socket connections.

Other drawbacks relate to mechanical considerations. Typically, VRMs are placed into environments that employ forced convection cooling via one or more fans. The airflow over the VRM and/or other system components may induce mechanical resonances. These resonances may, in turn, be coupled into the connection between the VRM and the motherboard, leading to connection failures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 2c is a plan view illustrating further details of how a voltage regulation module is connected to an integrated heat spreader in the embodiment of FIG. 2a;

DETAILED DESCRIPTION OF PREFERRED EMBODIMENTS

Embodiments of a detachable on package voltage regulation module are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In accordance with principles of the invention, embodiments of packaging schemes are disclosed herein that locate a voltage regulation module or voltage regulation components proximate to a processor or similar high-power integrated circuit in a manner that enhances mechanical robustness while reducing heat generation and failure modes found in the prior art. The packaging schemes include packages with on-package VRMs (or VRM components), eliminating the need to provide separate mounting provisions for a VRM or VRM components on a system's motherboard.

Figure 2A:
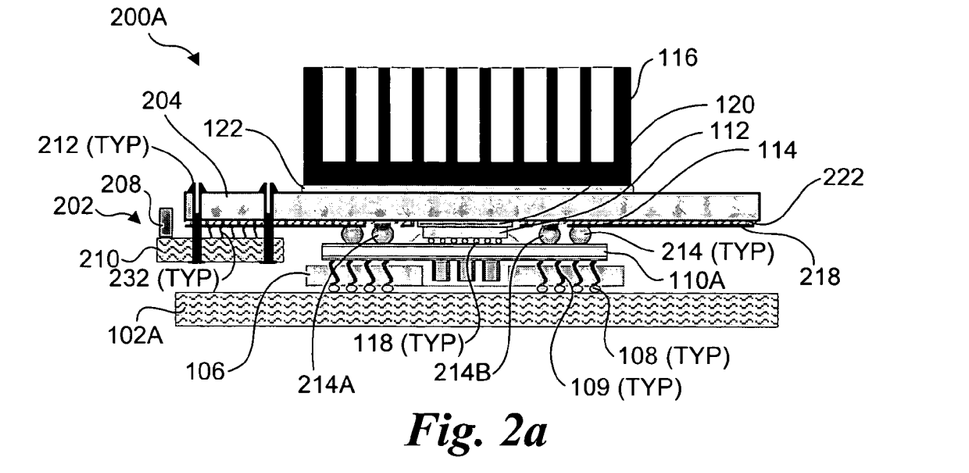
FIGS. 2a and 2b respectively show elevation cross-section views of a first set of exemplary IC packaging schemes, according to an embodiment of the invention.
Figure 2B:
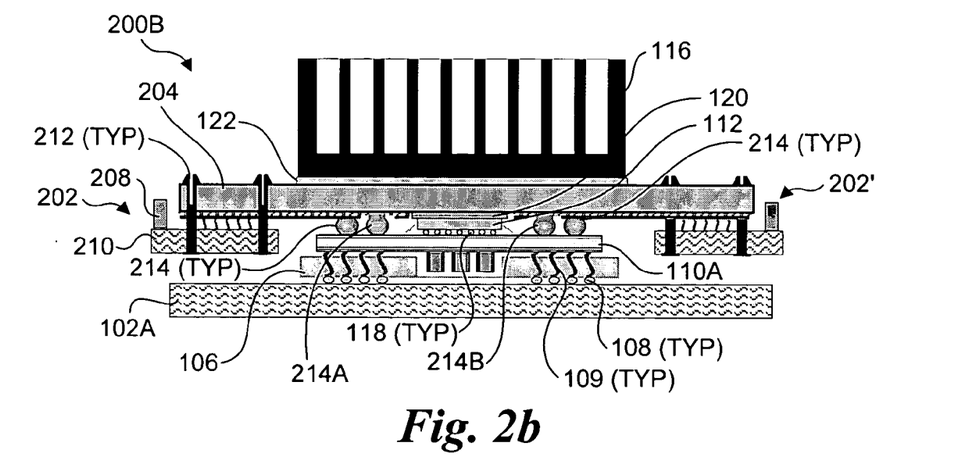
Figure 2C:
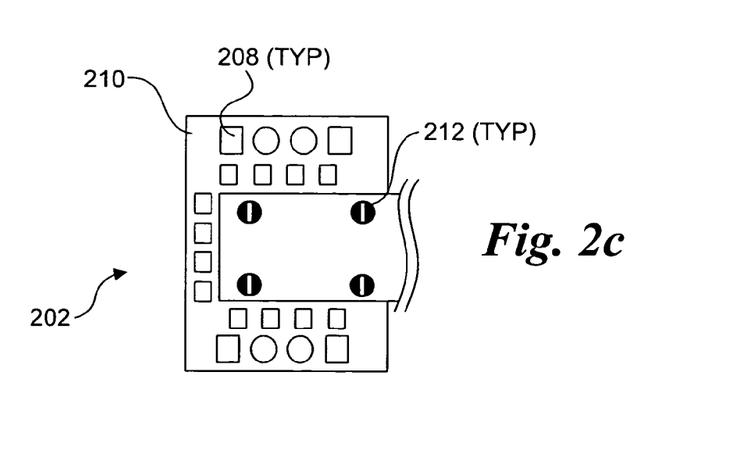

Details of IC packages 200A and 200B comprising a first set of exemplary embodiments of the invention are shown in FIGS. 2a–c. As shown in FIGS. 2a and 2b, many of the packaging components shown in the lower portion of IC packages 200A and 200B are similar to those discussed above with reference to the conventional packaging scheme shown in FIGS. 1a and 1b. These components are liked numbered to those shown in FIGS. 1a and 1b and include a motherboard 102A (similar to motherboard 102, but without the VRM components or VRM connector), a socket 106, solder connections 108, socket connections 109, thermal paste 120, a substrate 110A (similar to substrate 110, but with a different electrical layout on its topside), processor die 112 and solder balls 118 used to flip-bond the processor die to the substrate.

However, in contrast to the conventional packaging schemes of FIGS. 1a and 1b, each of the embodiments disclosed herein includes a VRM (or VRM components) that is included as part of an IC package, rather than being a separate part or set of components coupled to a motherboard or the like. For example, IC package 200A includes a VRM 202 that is attached to an integrated heat spreader 204, which in turn is attached to substrate 110A via solder balls 214. In the illustrated embodiment of FIG. 2a, components 208 of VRM 202 are mounted to a printed circuit board (PCB) 210, which is coupled to IHS 204 via a plurality of fasteners 212. In general, fasteners 212 may include any type of fastener that is suitable for coupling a small PCB to IHS 204, including but not limited to threaded fasteners (e.g., screws), rivets, pins, clips, etc. The embodiment of IC package 200B in FIG. 2b employs a similar configuration, except for now a second VRM 202' (or set of VRM components) is coupled to the opposite side of IHS 204. In general, the embodiment of IC package 200B is illustrative of configurations in which portions of a VRM assembly are located at more than one area around the outline of the package. Further details of the VRM mounting technique are shown in FIG. 2c.

An important consideration for each of the embodiments disclosed herein is the ability to provide electrical connectivity between the VRM and associated components. For example, there needs to be an electrical path between the connection points of the IC package (i.e., connectors 108) and the VRM to supply input power to the VRM. Additionally, there needs to be an electrical path between the output of the VRM and the substrate 110A, such that substrate 110A can provide the proper power input, and optionally, control input/output (I/O) signals to processor die 112.

Figure 2D:
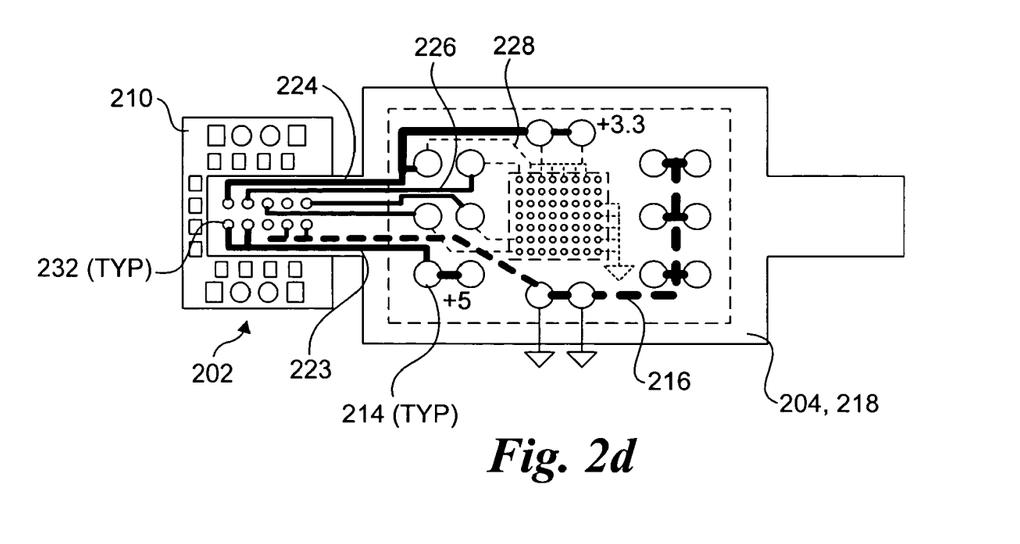
FIGS. 2d and 2e show interconnect layouts formed in an interconnect layer of an interconnect member, according to respective embodiments of invention.
Figure 2E:
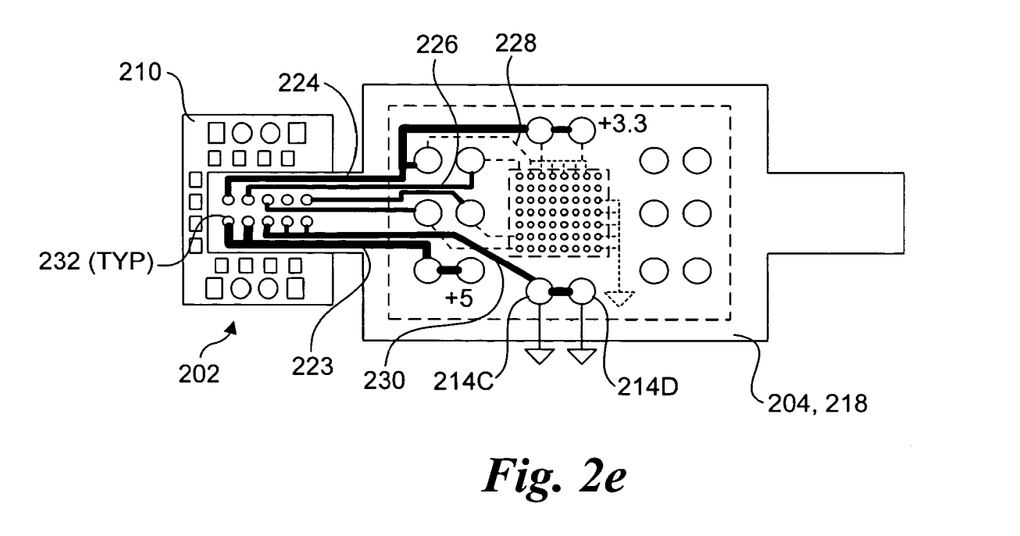

Exemplary electrical connectivity layouts in which integrated heat spreader 204 serves a dual role as both a heat dissipation means and an interconnect member are shown in FIGS. 2d and 2e. In one embodiment, electrical connectivity between IHS 204 and substrate 110A is provided by means of a plurality of solder balls or joints 214. The solder balls 214 serve two purposes: 1) electrical connectivity between traces and/or the body of IHS 204; and 2) a means for securely mounting the IHS (and thus heat sink 116) to the rest of the IC package. Other types of connection may also be used, such as wire bonds, mating connectors, etc. When these types of connections are employed, there will generally be a need to provide an alternate means for securing the IHS to the substrate, such as a high-strength epoxy or a mechanical assembly (e.g., a clip assembly, fasteners, etc.)

In the embodiment of FIG. 2d, the main body of IHS 204 is used for providing electrical connectivity to a common ground, effectively functioning as a ground plane. This is schematically illustrated by way of wide dashed lines 216, although it will be understood that the body of the IHS would provide a contiguous electrical connectivity path when employed as a ground plane. This enables a grounded connection between points in VRM 202 that are electrically connected to IHS 204 when IHS 204 is grounded. For example, as shown in the elevation cross-section view of FIG. 2a, solder balls 214A and 214B are electrically coupled to the underside of IHS 204. If these solder balls are connected to ground, then IHS 204, in turn, will also be connected to ground.

Meanwhile, a separate interconnect layer or layers 218 is used for routing power input, power output, and control I/O signals between VRM 202 and substrate 110A via corresponding electrical traces formed in the layer(s). Since the IHS body will generally be made of a material that is electrically conductive (which is required if the IHS is to be used as a ground plane), an insulative layer 222 needs to be placed between interconnect layer 218 and the main body of IHS 204. Interconnect layer 218 may generally comprise a single layer, or may comprises multiple layers in a manner analogous to multiple routing layers employed in a multi-layer PCB. In general, the interconnect layer will include electrical routing provisions for at least the power output from the VRM. In some instances, further traces will be provided to provide electrical connections for control I/O signals that are passed between the processor and the VRM. The continuous line circuit traces shown in FIGS. 2d and 2e correspond to layout traces contained in interconnect layer 218. These include power input traces 223, power output traces 224, and control I/O traces 226.

The IHS assembly (i.e., body, insulative layer 220 and interconnect layer 218 may be formed using one of many well-known circuit forming techniques. For example, in one embodiment the body of IHS 204 comprises a metal, such as copper, which is coated with an insulative layer, such as silicon dioxide ($SIO_2$), using a conventional semiconductor manufacturing process. A plurality of electrical traces, made of a metal such as copper, silver, or gold, are then formed over the $SIO_2$ insulative layer using another well-known process for forming electrical traces, such as low pressure vapor deposition or chemical etching.

The thin dashed lines 228 shown in FIGS. 2d and 2e illustrate electrical paths formed within (or on top of) substrate 11A, which are coupled at one end to solder balls 214 and are used to connect power output traces 224 and control I/O traces 226 (coupled via respective solder balls 214) to appropriate pads (via solder bumps 118) formed on the underside of processor die 112. Collectively, these electrical paths comprise a set of connections that electrically couple the substrate (and thus IHS 204) to the processor die. These traces may reside in the same layer as the power input traces, or may occupy one or more separate layers.

An alternative configuration to the embodiment of FIG. 2d is shown in FIG. 2e. Under this configuration, a ground input is coupled to VRM 202 via solder balls 214C and 214D and a ground trace 230 formed in connection layout plane 218. In one embodiment, ground trace 230 comprises a separate ground plane that is formed on a separate layer of connection layout plane 218. Optionally, ground trace 230 may occupy the same layer as the power and I/O traces. In some instances, it may be desirable to isolate the ground used for the processor die from the ground used for the rest of a system. The embodiment of FIG. 2e enables the ability to do this.

In general, PCB 210 of VRM 202 may be electrically coupled to the various traces, power, and ground planes provided by IHS 204 via one of several conventional connection techniques. These include, but are not limited to, wire bonds, mating connectors, and solder connections. For illustrative purposes, these connections are shown as connections 232.

Figure 3A:
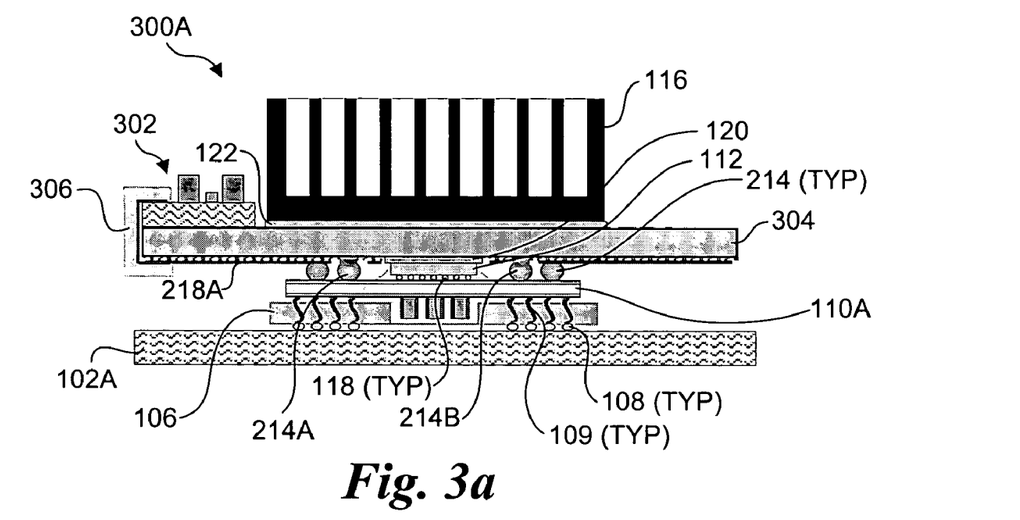
FIGS. 3a and 3b respectively show elevation cross-section views of a second set of exemplary IC packaging schemes, according to an embodiment of the invention.
Figure 3B:
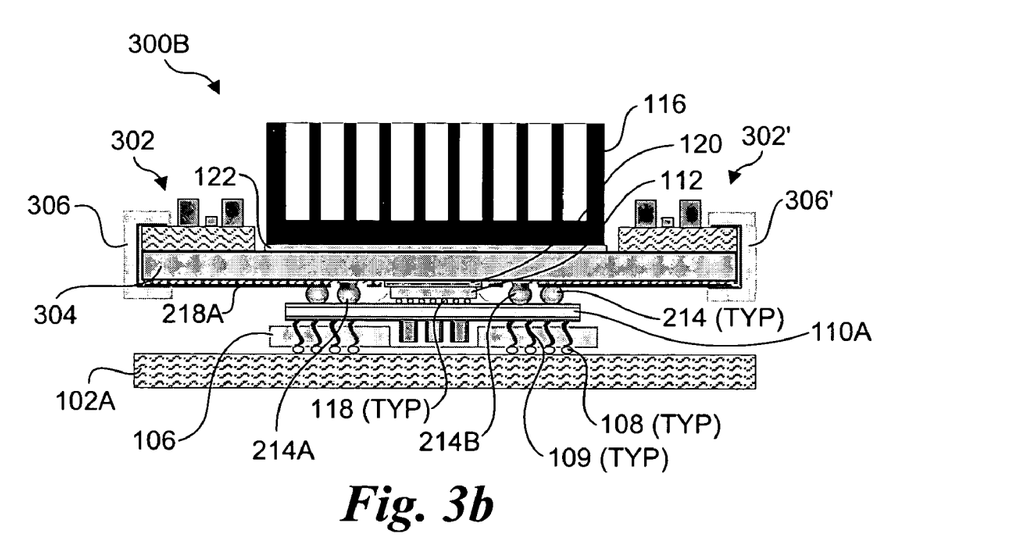

IC packages 300A and 300B corresponding to a second set of exemplary embodiments of the invention are shown in FIGS. 3a and 3b, respectively. Under these configurations, a single VRM 302 (for IC package 300A) or a pair of VRMs 302 and 302' (for IC package 300B) are mounted on the topside of an IHS 304. VRM 302 and VRM 302' are electrically coupled to electrical traces in an interconnect layer 218A formed on the underside of IHS 304 via edge connectors 306 and 306'. In general, edge connectors 306 and 306' may comprise a connector type that is similar to that used for personal computer (PC) add-on cards, wherein respective connectors are disposed on the insides of the connector and configured to couple to traces formed on the edge of a PC add-on card. Optionally, a flex cable (not shown) may be used in place of an edge connector. As yet another option, a pinned side connector may also be used. In general, the remaining components of IC packages 300A and 300b having the same reference numbers as those components shown in FIGS. 1a–b and 2a–b and discussed above perform similar functions to the earlier components.

Figure 4A:
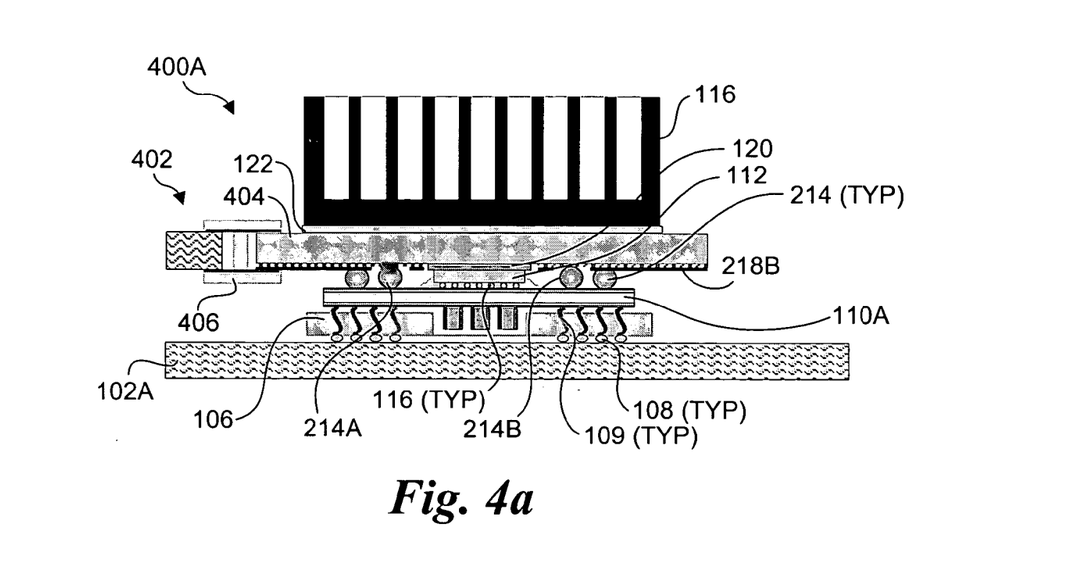
FIGS. 4a and 4b respectively show elevation cross-section views of a third set of exemplary IC packaging schemes, according to an embodiment of the invention.
Figure 4B:
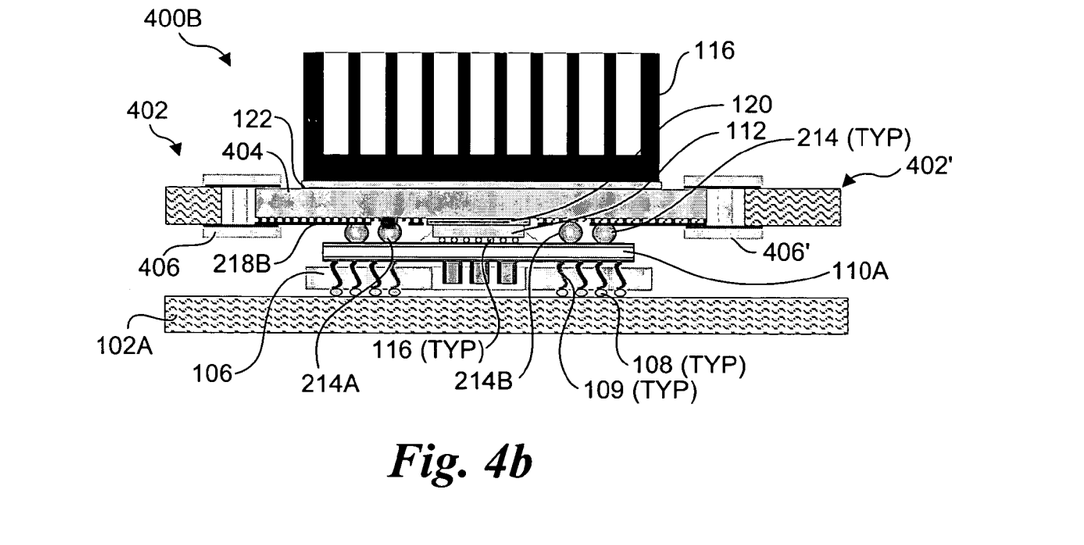

IC packages 400A and 400B corresponding to a third set of exemplary embodiments of the invention are shown in FIGS. 4a and 4b, respectively. In general, the components of IC packages 400A and 400b having the same reference numbers as those components shown in FIGS. 1a–b and 2a–b and discussed above perform similar functions to the earlier components. Under these configurations, a single VRM 402 (for IC package 400A) or a pair of VRMs 402 and 402' (for IC package 400B) are coupled to one or both ends of an IHS 404, such that the VRM's PCB's are substantially parallel with the IHS. VRM 402 and VRM 402' are electrically coupled to electrical traces in an interconnect layer 218B formed on the underside of IHS 404 via edge couplers 406 and 406'. In general, edge couplers 406 and 406' may comprise a configuration similar to an edge connector that provides connection means on one side. In one embodiment, a flex cable (not shown) may be used to provide the electrical connection to the VRM, while edge couplers 406 and 406' comprise mechanical couplings that are solely employed for mechanically coupling VRM's 402 and 402' to IHS 404. In general, the remaining components of IC packages 400A and 400b having the same reference numbers as those components shown in FIGS. 1a–b and 2a–b and discussed above perform similar functions to the earlier components.

Figure 5:
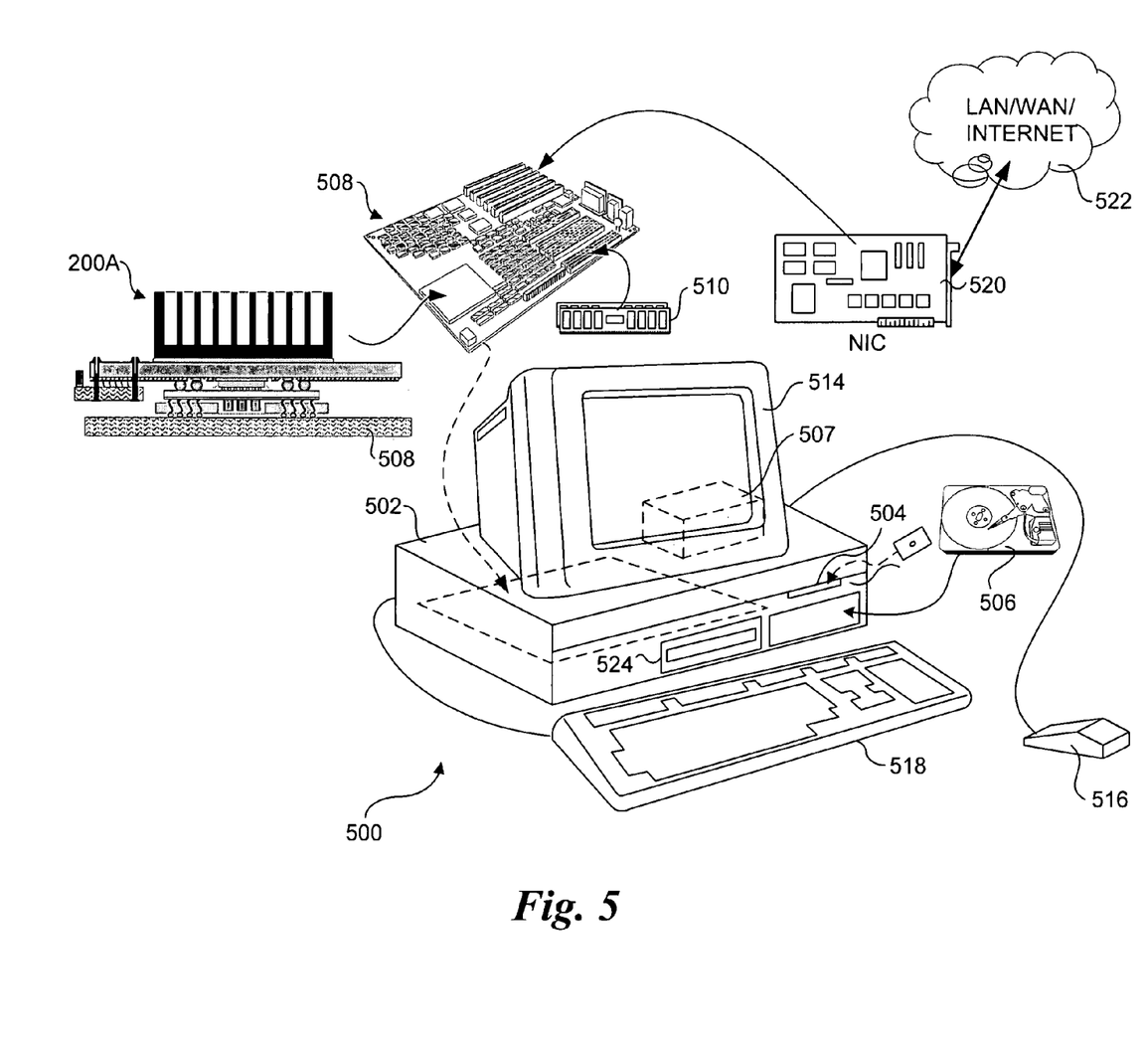
FIG. 5 is a schematic drawing of an exemplary computer system in which IC package embodiments of the invention may be employed.

FIG. 5 illustrates an embodiment of an exemplary computer system 500 in which embodiments of the invention may be employed. Computer system 500 is generally illustrative of various types of computer devices, including personal computers, laptop computers, workstations, servers, etc. For simplicity, only the basic components of the computer system are discussed herein. Computer system 500 includes a chassis 502 in which various components are housed, including a floppy disk drive 504, a hard disk 506, a power supply 507, and a motherboard 508. The power supply 507 provides power to the motherboard and components attached thereto, as well as various peripheral devices, such as floppy disk drive 504 and hard disk 506. Hard disk 506 may comprise a single unit, or multiple units, and may optionally reside outside of computer system 500. The motherboard 508 includes a memory 510 coupled to one or more processors packaged using one of IC packages 200A (illustrated), 200B, 300A, 300B, 400A, and 400B. Memory 510 may include, but is not limited to, Dynamic Random Access Memory (DRAM), Static Random Access Memory (SRAM), Synchronized Dynamic Random Access Memory (SDRAM), Rambus Dynamic Random Access Memory (RDRAM), or the like. IC package 200A includes a processor die corresponding to a microprocessor including, but not limited to, a CISC (complex instruction set computer) processor, such as an Intel Corporation x86, Pentium, or Itanium family microprocessor, a Motorola family microprocessor, or a RISC (reduced instruction set computer) processor, such as a SUN SPARC processor or the like.

A monitor 514 is included for displaying graphics and text generated by firmware, software programs and program modules that are run by computer system 500. A mouse 516 (or other pointing device) may be connected to a serial port, USB (Universal Serial Bus) port, or other like bus port communicatively coupled to processor 512. A keyboard 518 is communicatively coupled to motherboard 508 in a similar manner as mouse 516 for user entry of text and commands. In one embodiment, computer system 500 also includes a network interface card (NIC) 520 or built-in NIC interface (not shown) for connecting computer system 500 to a computer network 522, such as a local area network (LAN), wide area network (WAN), or the Internet.

Computer system 500 may also optionally include a compact disk-read only memory ("CD-ROM") drive 524 into which a CD-ROM disk may be inserted so that executable files, such as an operating system, and data on the disk can be read or transferred into memory 510 and/or hard disk 506. Other mass memory storage devices may be included in computer system 500.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An integrated circuit (IC) package, comprising:
an IC die having a planar topside surface;
a substrate to which the IC die is operatively coupled, including a first set of connections coupled between the substrate and the IC die and a second set of connections to couple the substrate to one of a connector or a printed circuit board;
a voltage regulation module (VRM) to provide a regulated voltage to the IC die; and
an interconnect member coupled between the VRM and the substrate, the interconnect member comprising:
a thermally and electrically conductive integrated heat spreader (IHS) thermally coupled to the planar topside surface of the IC die and electrically coupled to the VRM and at least one connector from among the first and second set of connections, and
an interconnect layer formed on a surface of the IHS and separated therefrom by an insulating layer, the interconnect layer providing a plurality of electrical pathways that enable the VRM to be electrically coupled to at least a portion of the first and second set of connections.

2. The IC package of claim 1, further comprising a heat sink having a planar surface thermally coupled to a planar topside surface of the integrated heat spreader.

3. The IC package of claim 1, further comprising a socket to which the substrate is operatively coupled via a plurality of pins coupled to the second set of connectors.

4. The IC package of claim 1, wherein the IC die is flip-bonded to the substrate via a plurality of solder bumps that also serve as the first set of connections.

5. The IC package of claim 1, wherein the interconnect member is coupled to the substrate via a plurality of solder joints.

6. The IC package of claim 1, wherein the IHS serves as one of a ground or power plane.

7. The IC package of claim 1, wherein the electrical pathways include pathways for providing an interconnect between control input/output connections for the IC die and the VRM.

8. The IC package of claim 1, wherein the IC die comprises a processor die.

9. The IC package of claim 1, wherein the VRM is coupled to the interconnect member via at least one fastener.

10. The IC package of claim 1, wherein the VRM is electrically coupled to the interconnect member via an edge connector.

11. The IC package of claim 1, wherein the VRM is coupled to the interconnect member via a parallel coupling member.

12. The IC package of claim 1, further including a second VRM coupled to the interconnect member.

13. The IC package of claim 1, wherein the VRM comprises a printed circuit board on which a plurality of voltage regulation components are mounted, and the VRM is coupled to the interconnect member in a manner that is detachable.

14. The IC package of claim 13, wherein the VRM includes a connector coupled to the printed circuit board via which the VRM is electrically coupled to the interconnect member.

15. The IC package of claim 1, wherein the VRM is electrically coupled to the interconnect member with at least one wire bond.

16. The IC package of claim 1, wherein the interconnect member is electrically coupled to the substrate with at least one wire bond.

17. An integrated circuit (IC) package, comprising:
processing means having a planar topside;
a substrate to which an underside of the processing means is coupled;
voltage regulation means for providing a regulated voltage to the processing means;
interconnect means coupled between the voltage regulation means and the substrate, the interconnect means comprising:
a thermally and electrically conductive heat transfer means, the heat transfer means being thermally coupled to the planar topside surface of the processing means and electrically coupled to the voltage regulation means and to the substrate, and
connection means formed on a surface of the heat transfer means and separated therefrom by an insulating layer, the connection means providing a plurality of electrical pathways that enable the voltage regulation means to be electrically coupled to the substrate.

18. The IC package of claim 17, wherein the heat transfer means comprises an integrated heat spreader that is thermally coupled to the processing means via a thermal interface material.

19. The IC package of claim 18, further comprising heat dissipation means thermally coupled to a topside surface of the integrated heat spreader.

20. The IC package of claim 17, wherein the heat transfer means serves as one of a ground or power plane.

21. The IC package of claim 17, wherein the connection means includes at least one conductive layer in which a plurality of electrical traces are formed to provide interconnections between the voltage regulation means and the substrate.

22. The IC package of claim 17, wherein the connection means includes interconnections for electrically coupling input/output signals between the VRM and the processing means.

23. The IC package of claim 17, further comprising a second voltage regulation means coupled to the interconnect means, for providing regulated voltage to the processing means.

24. A system, comprising:
a motherboard;
a power supply, to supply power to the motherboard; and
a processor package, operatively coupled to the motherboard, including:
a processor die having a planar topside surface;
a substrate to which the processor die is operatively coupled, including a first set of connections coupled between the substrate and the processor die and a second set of connections electrically coupled to the motherboard;
a voltage regulation module (VRM) to provide a regulated voltage to the processor die in response to an electrical input provided by the power supply; and
an interconnect member coupled between the VRM and the substrate, the interconnect member comprising:
a thermally and electrically conductive integrated heat spreader (IHS) thermally coupled to the planar topside surface of the processor die and electrically coupled to the VRM and at least one connector from among the first and second set of connections, and an interconnect layer formed on a surface of the IHS and separated therefrom by an insulating layer, the interconnect layer providing a plurality of electrical pathways that enable the VRM to be electrically coupled to at least a portion of the first and second set of connections.

25. The system of claim 24, wherein the processor die is flip-bonded to the substrate via a plurality of solder bumps that also serve as the first set of connections.

26. The system of claim 24, wherein the voltage regulation module comprises a printed circuit board to which a plurality of voltage regulation components are mounted.

27. The system of claim 24, wherein the processor package is coupled to the motherboard via a socketed connector.

* * * * *